United States Patent
Zurcher et al.

(10) Patent No.: US 6,344,413 B1
(45) Date of Patent: *Feb. 5, 2002

(54) METHOD FOR FORMING A SEMICONDUCTOR DEVICE

(75) Inventors: Peter Zurcher, Scottsdale, AZ (US); Robert E. Jones, Jr., Austin, TX (US); Papu D. Maniar, Mesa, AZ (US); Peir Chu, Pflugerville, TX (US)

(73) Assignee: Motorola Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/022,756

(22) Filed: Feb. 12, 1998

Related U.S. Application Data

(63) Continuation-in-part of application No. 08/995,534, filed on Dec. 22, 1997, now abandoned.

(51) Int. Cl.$^7$ ............................................. H01L 21/70
(52) U.S. Cl. ........................ 438/678; 438/240; 438/387
(58) Field of Search .................................. 361/313, 311, 361/305; 438/678, 650, 396, 397, 660, 240, 3, 387, 388, 398, 399, 239, 243, 244

(56) References Cited

U.S. PATENT DOCUMENTS

| | | | |
|---|---|---|---|
| 5,063,169 A | 11/1991 | Bruin et al. | 437/41 |
| 5,155,573 A | 10/1992 | Abe et al. | 357/51 |

(List continued on next page.)

FOREIGN PATENT DOCUMENTS

| JP | 402178910 | * 7/1990 | 04/12 |
|---|---|---|---|

OTHER PUBLICATIONS

Y. Kohyama et al, "A Fully Printable, Self–aligned and Planarized Stacked Capacitor DRAM Cell Technology for 1Gbit DRAM and Beyond", 1997 Symposium on VLSI Tech. Digest of Technical Papers, Section 3A–1, pp. 17–18.

J. M. Drynan et al., "Cylindrical Full Metal Capacitor Technology for High–Speed Gigabit DRAMs", 1997 Symposium on VLSI Technology Digest of Technical Papers, Section 12–1, pp. 151–152.

S. Yamamichi et al., "An ECR MOCVD (Ba,Sr) TiO$_3$ based stacked capacitor technology with RuO$_2$/Ru/TiN/TiSi$_x$ storage nodes for Gbit–scale DRAMs", 1995 IEDM IEEE, pp. 119–122.

M. Kruger et al., "Platinised Titanium as an Insoluble Anode in Electroplating", Trans. Inst. Metal Finishing, 1976, vol. 54, pgs. 127–132.

R. M. Skomoroski et al., "Performance of Plantinum–Clad Tantalum Anodes in Electroplating", Plating, vol. 60, No. 60, pp. 1115–1119 (1973).

J. Y. Lee et al. Simultaneously Formed Storage Node Contact and Metal Contact Cell (SSMC) For 1Gb DRAM and Beyond, IEEE, International Electron Devices Meeting, pp. 593–597 (1996).

(List continued on next page.)

Primary Examiner—Charles Bowers
Assistant Examiner—Laura Schillinger

(57) ABSTRACT

Method for forming a semiconductor device having an capacitor, where the capacitor is in-laid in a cavity formed in the semiconductor substrate and part of a high density memory. One embodiment first forms a bottom electrode in the cavity and then fills the cavity with a sacrificial layer to allow chemical mechanical polishing (CMP) of at least one of the capacitor electrodes. After removing portions of the bottom electrode and portions of the sacrificial layer, a dielectric layer is formed. A top electrode is then formed over the dielectric layer. The dielectric layer so formed isolates the bottom electrode from the top electrode preventing shorting and leakage currents. In one embodiment, a single top electrode layer is formed for multiple bottom electrodes, reducing the complexity of the memory circuit.

35 Claims, 6 Drawing Sheets

U.S. PATENT DOCUMENTS

| | | | |
|---|---|---|---|
| 5,169,680 A | 12/1992 | Ting et al. .................... 427/96 |
| 5,185,689 A | 2/1993 | Maniar ....................... 361/313 |
| 5,191,510 A | 3/1993 | Huffman ..................... 361/313 |
| 5,196,909 A | 3/1993 | Chan et al. ................. 257/296 |
| 5,300,799 A | 4/1994 | Nakamura et al. .......... 257/295 |
| 5,381,302 A | 1/1995 | Sandhu et al. .............. 361/305 |
| 5,439,840 A | 8/1995 | Jones, Jr. et al ............. 437/52 |
| 5,521,418 A | 5/1996 | Kohyama ................... 257/390 |
| 5,576,928 A | * 11/1996 | Summerfelt et al. ........ 361/321 |
| 5,624,865 A | 4/1997 | Schuegraf et al. .......... 438/396 |
| 5,627,094 A | 5/1997 | Chan et al. ................. 438/253 |
| 5,658,818 A | 8/1997 | Akram et al. ................ 437/60 |
| 5,674,787 A | 10/1997 | Zhao et al. ................. 437/230 |
| 5,696,017 A | 12/1997 | Ueno .......................... 437/60 |
| 5,717,250 A | 2/1998 | Schuele et al. ............. 257/754 |
| 5,757,612 A | * 5/1998 | Acosta et al. ............... 361/321 |
| 5,776,825 A | 7/1998 | Suganaga et al. ........... 438/618 |
| 5,789,320 A | * 8/1998 | Andricacos et al. ........ 438/678 |
| 5,793,600 A | 8/1998 | Fukuda et al. ........... 361/321.4 |
| 5,821,141 A | 10/1998 | Huang ........................ 438/253 |
| 5,851,876 A | * 12/1998 | Jenq ........................... 438/253 |
| 5,932,907 A | * 8/1999 | Grill et al. .................. 257/310 |
| 5,976,928 A | * 11/1999 | Kirlin et al. ................ 438/240 |
| 6,069,391 A | * 8/2000 | Muffoletto et al. ......... 427/580 |
| 6,188,120 B1 | * 2/2001 | Andricacos ................. 257/532 |

OTHER PUBLICATIONS

P. Y. Lesaicherre et al., A Gbit–Scale DRAM Stacked Capacitor Technology with ECR MOCVD SrTiO3 and RIE Patterned RuO2/TiN Storage Nodes, IEEE, International Electron Devices Meeting, pp. 831–834 (1994).

Metal Finishing —Guidebook and Directory Issue 1990; Jan. '90; vol. 85, No. 1A; pp. 312–313 and 260–261.

Making the Move to Dual Damascene Processing; Semiconductor International; August 1997; pp. 79–81.

* cited by examiner

US 6,344,413 B1

METHOD FOR FORMING A SEMICONDUCTOR DEVICE

CROSS-REFERENCE TO RELATED APPLICATION

This application is a continuation-in-part of a commonly assigned pending U.S. patent application Ser. No. 08/995,534 by Peter Zurcher et al. entitled "Method For Forming A Semiconductor Device," filed on Dec. 22, 1997 now abandoned.

FIELD OF THE INVENTION

The present invention generally relates to semiconductor devices, and more particularly, to a scaled down memory capacitor which enables high density integrated circuit manufacturing.

BACKGROUND OF THE INVENTION

Semiconductor devices are requiring larger and larger memory densities. A dynamic-random-access memory (DRAM) cell is an example of one type of memory. FIG. 1 includes a schematic diagram of a DRAM memory cell 25 that includes a transistor 5 and a capacitor 10. A source/drain region of transistor 5 is electrically connected to a bit line 20, and the other source/drain region of transistor 5 is electrically connected to one of the electrodes of capacitor 10. The gate electrode of transistor 5 is electrically connected to a word line 15. The other electrode of capacitor 10 is electrically connected to VSS or a substantially constant potential (not shown). A one-transistor, one-capacitor ferroelectric random-access memory (FeRAM) is similar except that the electrode of capacitor 10 is electrically connected to a drive line instead of VSS or a substantially constant potential.

When the memory cell 25 is shrunk, capacitance of capacitor 10 must be kept high enough to allow proper sensing of the memory cell 25. As the processing technology is taken below 0.50 $\mu$m, difficulties arise.

Capacitance is given by the formula:

$$C = \frac{k \cdot \varepsilon_0 \cdot A}{d}$$

Silicon dioxide is a common type of capacitor dielectric. However, its thickness cannot be taken lower than 40 Å because it cannot be reproducibly made in a manufacturing environment without defects. Additionally, reduced thickness increases potential leakage current, which effects the time necessary to refresh the memory cell. Nontraditional high dielectric constant materials having a dielectric constant higher than 10 typically have process compatibility issues. Polysilicon electrodes may not be used because many of the nontraditional high dielectric constant materials may adversely interact with those materials.

Still another attempt to increase capacitance is to increase the capacitor area. To achieve higher capacitor area without occupying additional substrate area, capacitors are including a vertical component as seen in FIG. 2. Memory cell 25 includes transistor 5 and capacitor 10 that are illustrated with dashed lines. Transistor 5 is electrically connected to capacitor 10 by contact plug 26 that has a width of "f." The capacitor includes lower electrode 30 having a "U" shape, a capacitor dielectric layer 40, and an upper electrode 35. The capacitor 10 has side extensions that are oriented in the Z direction as shown in FIG. 2. The Z-direction orientation complicates the manufacturing of memory cell 25. The films that make up the capacitor 10 may need to be conformally deposited and the subsequent interlevel dielectric layer (not shown) deposited and planarized without adversely affecting the upper electrode 35 or forming voids.

DETAILED DESCRIPTION OF A PREFERRED EMBODIMENT

The present invention provides a method of forming a high density bit cell capacitor compatible with a multilevel metal process for semiconductor technologies below 0.5 $\mu$m. As noted above, many prior art methods of forming capacitors at smaller geometries seek to take advantage of the relation of capacitance to capacitor area. In one example, where a capacitor has an increased vertical height, the method results in decreased global planarization. The present invention avoids many of the problems associated with prior art methods. The present invention is beneficial in the manufacture of dynamic random access memory (DRAM) circuits and nonvolatile ferroelectric memories, such as ferroelectric random access memory (FeRAM) devices.

Figure 15:
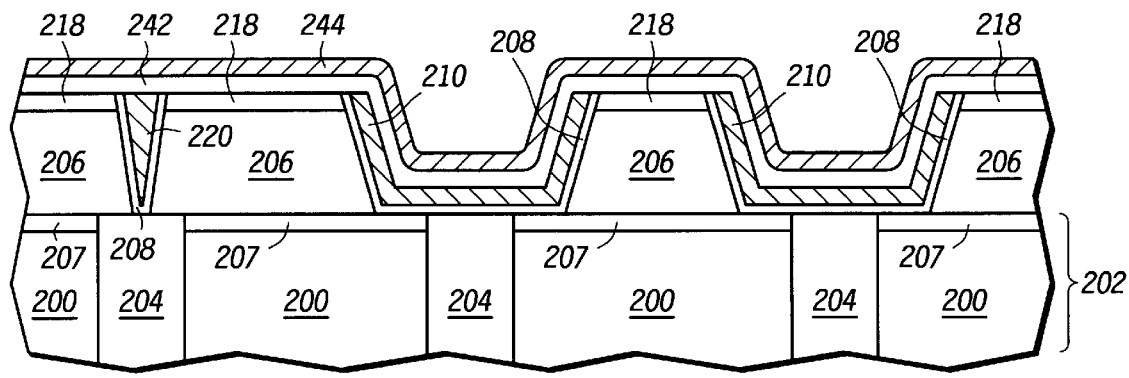
Figure 16:
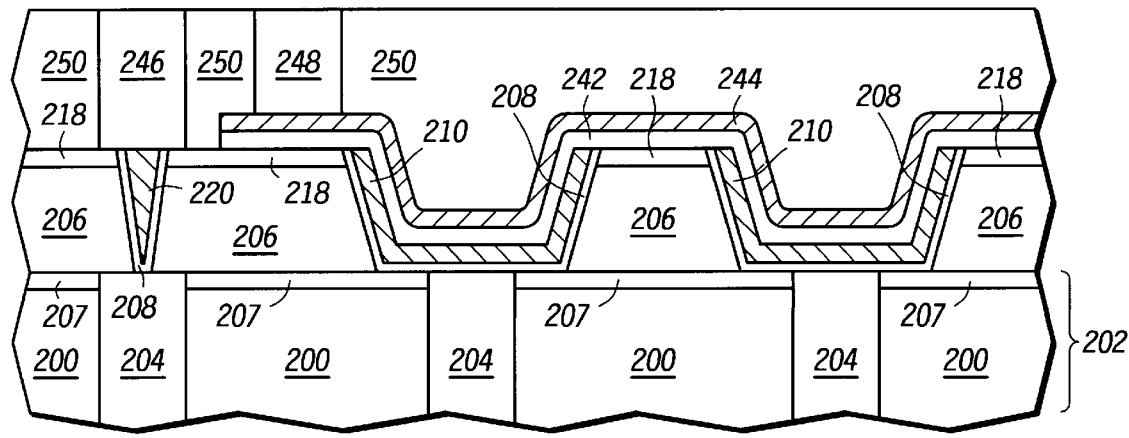
Figure 17:
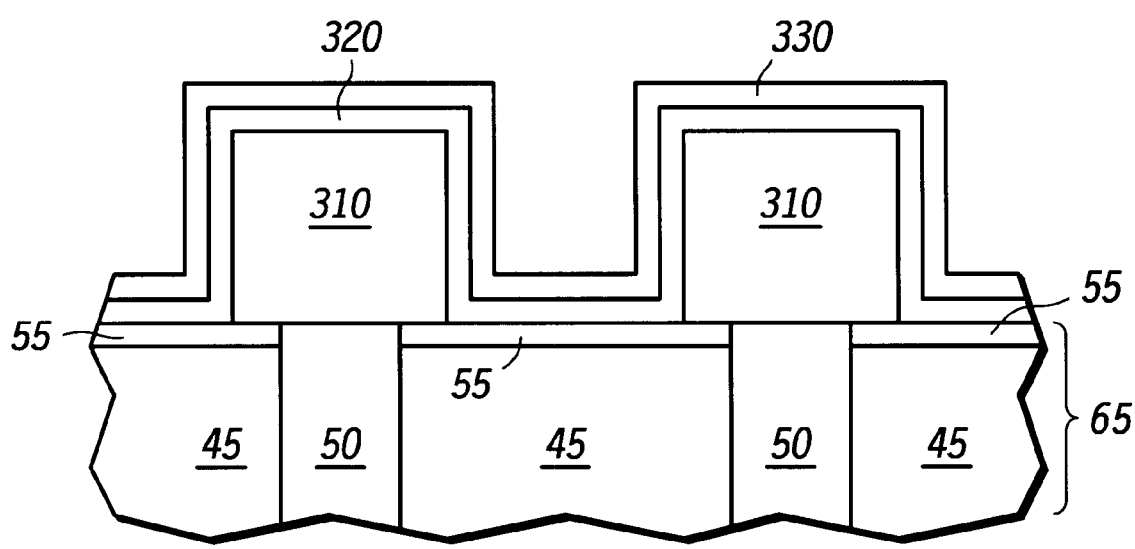
FIGS. 17 is a cross sectional view of the method of forming a capacitor according to a third embodiment of the present invention

FIGS. 3–10 illustrate a method of making a first embodiment of the capacitor of the present invention, FIGS. 11–16 illustrate a method of making a second embodiment of the present invention; and FIG. 17 illustrates a method of making a third embodiment of the present invention.

In one embodiment, the present invention provides an inlaid capacitor where each electrode is formed using an oxygen-tolerant material, and the dielectric material has a high dielectric constant material. The process is illustrated in FIGS. 3–10.

Figure 1:
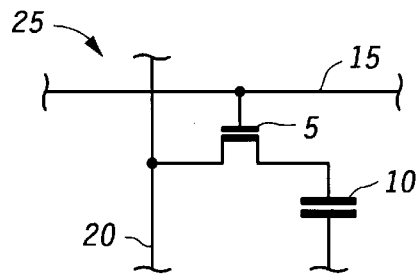
FIG. 1 is a circuit view of a prior art DRAM bit cell.
Figure 2:
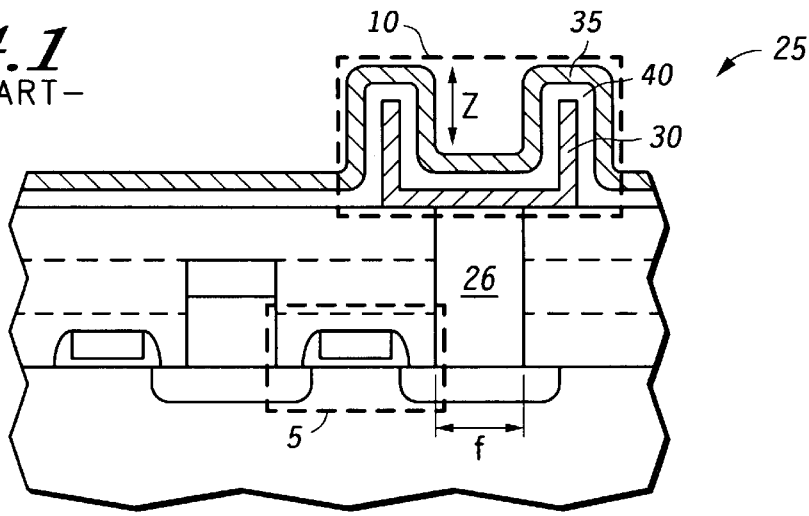
FIG. 2 is a cross sectional view of the prior art DRAM bit cell of FIG. 1.
Figure 3:
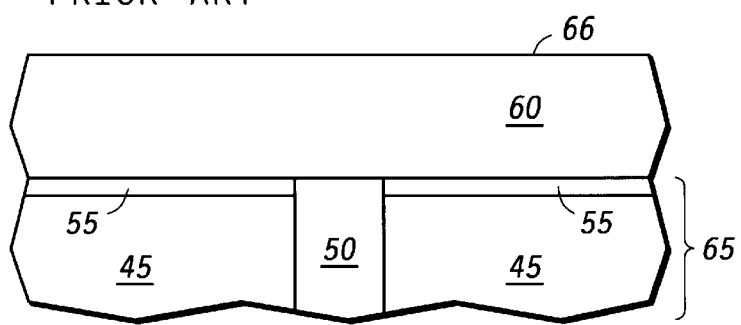
FIGS. 3–10 are cross sectional views of successive steps of the method of forming a capacitor according to one embodiment of the present invention.
Figure 4:
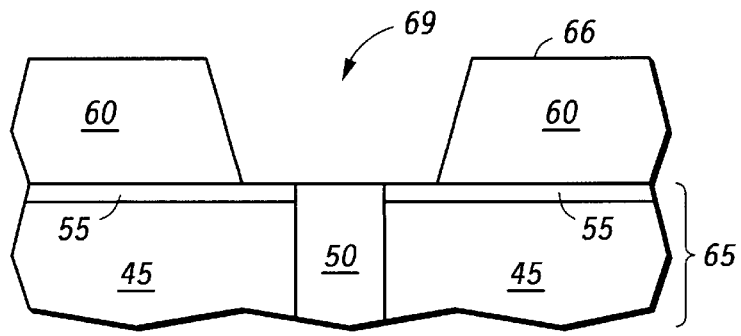
Figure 5:
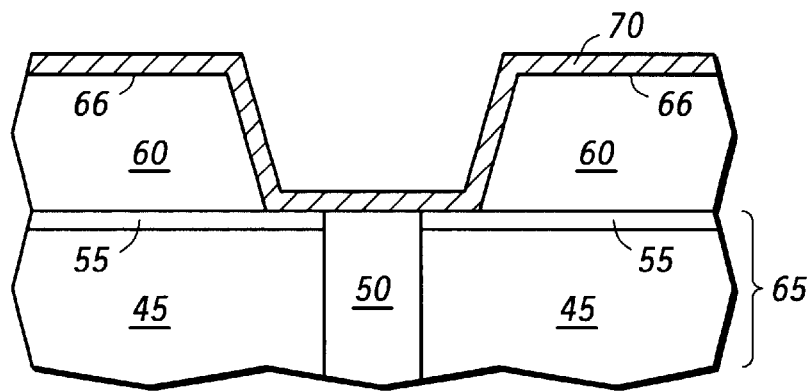

FIG. 3 is a cross sectional view of a first step in the process of making a first embodiment of the present invention. In FIG. 3, a substrate 65 has a substrate interlevel dielectric 45 with etch stop 55 overlying the substrate interlevel dielectric 45. The etch stop 55 is typically silicon nitride, but other materials may be used. A contact plug 50 is located within the substrate interlevel dielectric 45 and the etch stop 55. A first interlevel dielectric layer 60 overlying the substrate 65. A first step is to deposit a first interlevel dielectric layer 60 on the substrate 65. The first interlevel dielectric layer 60 has an upper surface 66. Processing continues as illustrated in FIG. 4 by forming a first capacitor cavity 69 in the first interlevel dielectric layer 60. The first capacitor cavity 69 is formed and exposes the contact plug 50 along with portions of etch stop 55 around contact plug 50. The walls of the first capacitor cavity 69 can be adjusted depending on how conformally subsequent layers are deposited within the cavity 69. Conformally deposited layers which are uniform over the entire first capacitor cavity 69 surface allow the walls of first capacitor cavity 69 to be vertical (not illustrated). In contrast, where the conformally deposited layer is not uniform over the entire first capacitor cavity 69 surface, such as typically occurs with sputter deposition, the walls of the first capacitor cavity 69 may be tapered as illustrated in FIG. 5. Tapering is achieved by conventional processing. However, according to an embodiment of the present invention, subsequent layers, particularly the electrode layers of the capacitor, may be formed by plating, including electroless plating and electroplating (electrolytic plating). These aspects of the present invention are described in more detail herein below.

FIG. 5 is a cross sectional view of the first embodiment of the present invention after further processing. In FIG. 5, a first capacitor electrode layer 70 is deposited overlying the upper surface 66 of the first interlevel dielectric layer 60 and within first capacitor cavity 69 to overlie the exposed portions of etch stop 55 and contact plug 50. The first capacitor electrode layer 70 is a conducting layer, which may be composed of a noble metal (platinum (Pt), palladium (Pd), or the like), a metal that is capable of forming conductive metal oxide (ruthenium (Ru), rhenium (Re), rhodium (Rh), iridium (Ir), osmium (Os), or the like), a conductive metal oxide (ruthenium oxide ($RuO_2$), rhenium oxide ($ReO_2$, $ReO_3$), iridium oxide ($IrO_2$), osmium oxide ($OsO_2$), or the like), or combinations thereof. Alloys or multiple layers may be used also, such as Pt—Ti, Pt—Pd, Pt—Ir, etc. Other examples include strontium ruthenate ($SrRuO_3$), lanthanum strontium cobalt oxide (LSCO) or yttrium barium copper oxide (YBCO). Note that the first capacitor electrode layer 70 is also referred to as the bottom electrode.

An alternate embodiment of the present invention first forms a contact plug opening which includes first capacitor cavity 69 and the region filled by contact plug 50, as illustrated in FIG. 4. According to this alternate embodiment, the first capacitor electrode layer 70 is deposited within the contact plug opening, filling the contact plug 50 and conformally lining the first capacitor cavity 69.

Figure 6:
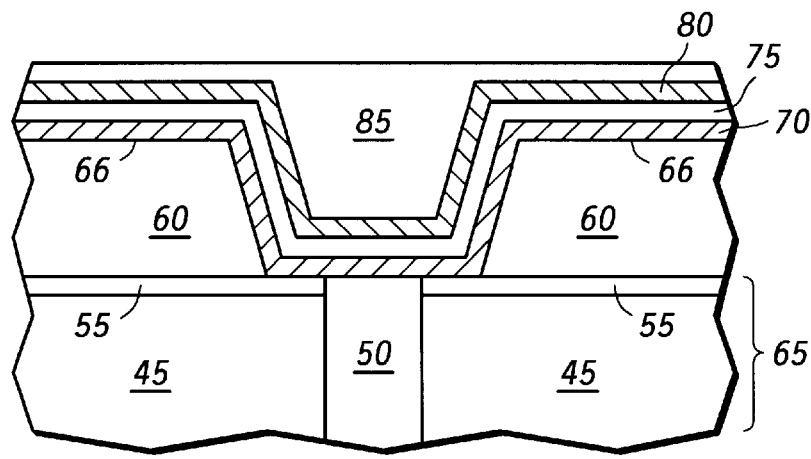

FIG. 6 is a cross sectional view of the first embodiment of the present invention after additional processing steps. As illustrated in FIG. 6, a capacitor dielectric layer 75 is deposited over the first capacitor electrode layer 70. The capacitor dielectric layer 75 is a high-k dielectric ($k \geq 10$) formed by chemical vapor deposition (CVD), sputter deposition or the like. The capacitor dielectric layer 75 may be composed of barium strontium titanate (BST), barium titanate (BTO), strontium titanate (STO), lead titanate (PT), lead zirconate (PZ), lead zirconate titanate (PZT), lead lanthanum zirconate titanate (PLZT), strontium bismuth tantalate (SBT), strontium bismuth niobate (SBN), or strontium bismuth niobate tantalate (SBNT). Preferably for DRAM applications the capacitor dielectric layer 75 may include atoms of BST or strontium titanate (ST).

Second capacitor electrode layer 80 is formed over the capacitor dielectric layer 75. The second capacitor electrode layer 80 is composed of any material listed regarding the first capacitor electrode layer 70. Typically the second capacitor electrode layer 80 is an oxygen-tolerant conductor. The two capacitor electrode layers 70 and 80 can include the same or different materials. The structure may be annealed at this point in the process. The anneal is performed at a temperature in a range of approximately 600–800° C. for a time no longer than approximately one hour. The anneal is performed by using a substantially inert or an oxidizing ambient. It is desirable for the dielectric to be in a perovskite phase or a layered perovskite phase, which may be accomplished by the above described anneal process performed after deposition, or alternatively by depositing the capacitor dielectric layer 75 at appropriate deposition conditions. If an FeRAM cell is being formed, the anneal is performed using an oxidizing ambient to convert the capacitor dielectric layer 75 to its perovskite state. Because the capacitor electrode layers 70 and 80 include oxygen-tolerant materials, the oxidizing ambient will not adversely affect them. Then, a sacrificial layer 85 is formed over the second capacitor electrode layer 80 to completely fill the remainder of first capacitor cavity 69.

Figure 7:
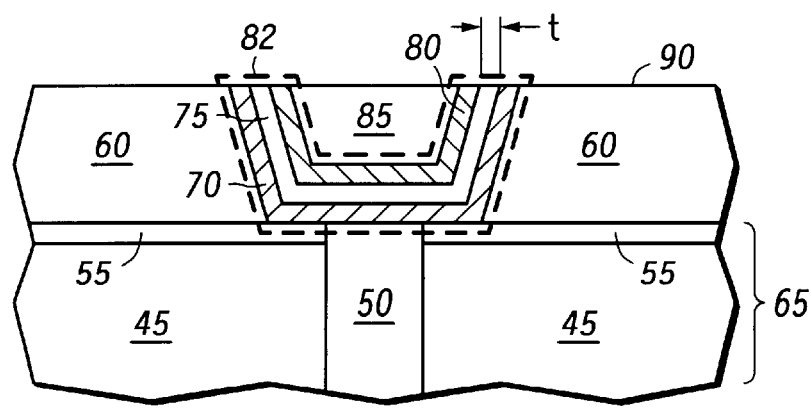

In FIG. 7 the device of FIG. 6 is subjected to a procedure for removing exposed portions of deposited layers, either chemical mechanical polishing (CMP) or etch back procedures, to achieve the device of FIG. 7. Specifically, using either one of these procedures, the exposed portions of the sacrificial layer 85, the second capacitor electrode layer 80, the capacitor dielectric layer 75 and the first capacitor electrode layer 70 are removed and planarized to form a planar surface 90 as illustrated in FIG. 7. The sacrificial layer 85 of FIG. 7 is typically silicon oxide, but may be an alternate material since such a layer is usually removed prior to additional processing. The advantage of using a silicon oxide material is that the sacrificial layer 85 may remain within the first capacitor cavity 69 during additional processing. The resultant structure as illustrated in FIG. 7 is an in-laid capacitor 82 which avoids forming Z direction extensions before forming the second interlevel dielectric layer, as in the prior art, and facilitates even surfacing over the wafer (i.e. enhances global planarization). The in-laid capacitor 82 includes the first capacitor electrode layer 70, the capacitor dielectric layer 75, and the second capacitor electrode layer 80.

Note that during the process of planarizing to expose surface 90, capacitor dielectric layer 75 only acts to separate the first capacitor electrode layer 70 from the second capacitor electrode layer 80 by way of the dielectric thickness "t", however there exists the possibility of shorting resulting in leakage. Shorting may occur by damage to the exposed surface of the capacitor dielectric layer 75 or by etch or polish residue and may facilitate leakage currents. A short-etch to remove small portions of capacitor electrode layers 70 and 80 may be performed to reduce the likelihood of electrical shorting.

Figure 8:
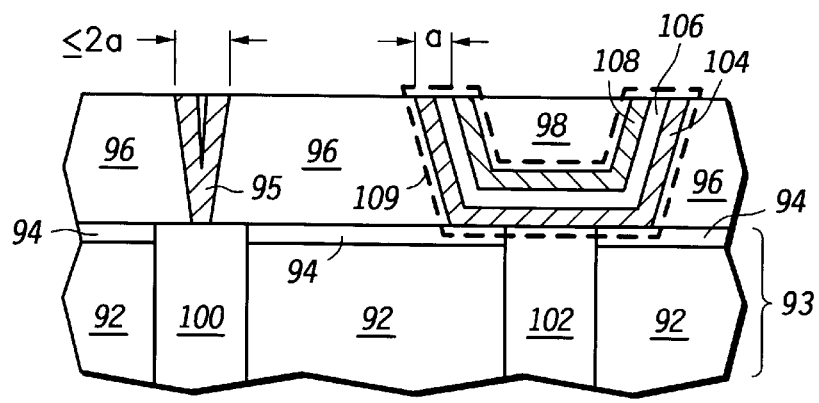

FIG. 8 illustrates the further processing of a device as in FIGS. 3–7. FIG. 8 is a cross-sectional view of a larger portion of the wafer, which includes substrate 93, substrate interlevel dielectric 92, contact plugs 100 and 102, etch-stop layer 94, a first interlevel dielectric layer 96, and a capacitor 109 formed by the first capacitor electrode layer 104 as the bottom electrode, capacitor dielectric layer 106, and the second capacitor electrode layer 108 as the top electrode, similar to the capacitor illustrated in FIG. 7. Note that a cavity created for the capacitor is filled with sacrificial layer 98. A combined dimension of the first capacitor electrode layer 104 and capacitor dielectric layer 106 is indicated as "a." In addition to the structures built according to the method illustrated in FIGS. 3–7, the wafer illustrated in FIG. 8 includes contact structure 95.

Continuing with FIG. 8, contact structure 95 may be used as a contact between a contact plug 100 (similar in structure to contact plug 50 of FIG. 3) and a contact formed in via 112 or a metal layer above the contact structure 95 (not shown). The contact structure 95 is made by forming a via hole during the same processing step as forming the first capacitor cavity 69 of FIG. 4. After the via hole is made, the via hole is filled with conducting material at the same step of depositing the first capacitor electrode layer 104 (similar to first capacitor electrode layer 70). Generally, the conducting material within the via hole is the same material as the material used for the first capacitor electrode layer 104. The width of the via hole at surface 97 will normally not be more than 2a. Otherwise a portion of the second capacitor electrode layer 108 would be formed in the via hole and result in an undesired capacitor structure.

Figure 9:
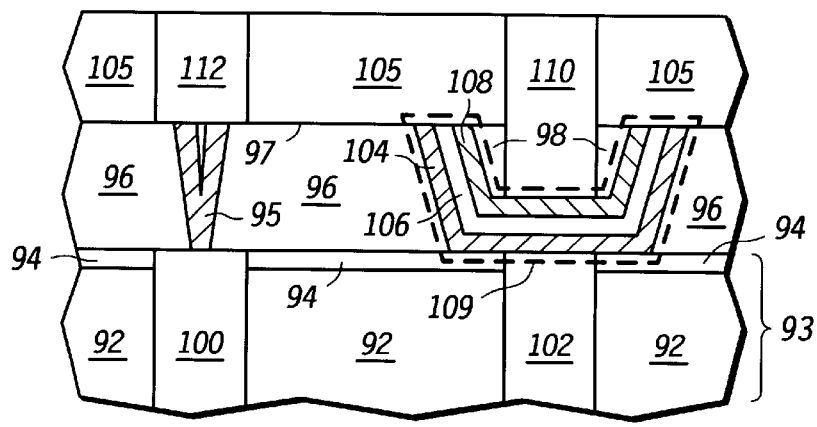

FIG. 9 is a cross-sectional view of the device of FIG. 8 after additional processing steps have been performed. In FIG. 9, a second interlevel dielectric layer 105 is formed over the device of FIG. 8. After the second interlevel dielectric layer 105 is formed, via 112 is formed within the second interlevel dielectric layer 105 overlying contact structure 95, and via 110 is formed overlying the capacitor formed by first and second capacitor electrode layers 104 and 108 along with capacitor dielectric layer 106. Via 110 contacts the second capacitor electrode layer 108.

Figure 10:
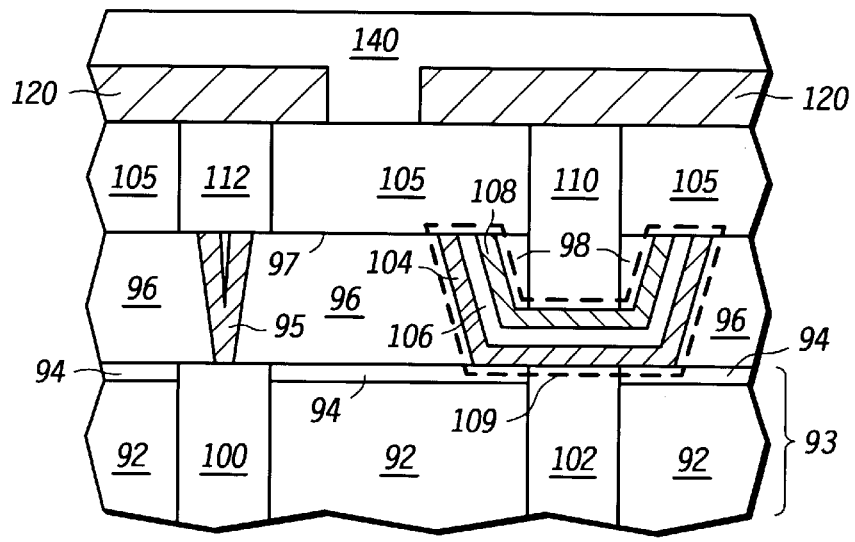

Interconnections are completed in FIG. 10, where metal interconnect layer 120 is formed over the second interlevel dielectric layer 105 making contact with contacts formed in vias 110 and 112. A portion of the second interlevel dielectric layer 105 may be exposed by etching or other processing in areas between vias 110 and 112 through the metal interconnect layer 120. As determined by circuit design, the patterning of the metal interconnect layer 120 may leave the layer 120 continuous between vias 110 and 112 to provide electrical coupling. Additional processing forms a passivation layer 140 over layer 120, and contacting the second interlevel dielectric layer 105 for the portion exposed between vias 110 and 112. At this point in processing, a substantially completed semiconductor device has been formed. In a DRAM cell or a FeRAM cell, a transistor (not shown) would be formed. The bit line could be the left-hand portion of metal interconnect layer 120. A bit line would be electrically connected to one source-drain region of the transistor. Alternatively, the bit line could be a buried bit line (not shown in FIG. 10). The right-hand portion of metal interconnect layer 120 is electrically connected to the second capacitor electrode layer 108, while the first capacitor electrode layer 104 is electrically coupled to the other source-drain region of the transistor. If a DRAM cell is formed, the right-hand portion is electrically coupled to a VSS electrode or a substantially constant potential source. If a FeRAM cell is formed, the right-hand portion is electrically connected to a drive line.

FIG. 10 illustrates an in-laid bit cell capacitor 109 where the first electrode layer 104 is coupled to contact plug 102 and the second capacitor electrode layer 108 is coupled to metal interconnect layer 120 through via 110. Further, FIG. 10 illustrates the contact structure 95 is formed from the same material as the first capacitor electrode layer 104.

According to one embodiment of the present invention, contact structure 95 is formed using the same material as used to form the first capacitor electrode layer 104. This embodiment forms the capacitor in one mask step. According to an alternate embodiment, contact areas, such as contact structure 95, are composed of traditional contact materials, such as tungsten or polysilicon. This alternate embodiment is accomplished in two mask steps. Still another embodiment distinguishes between connections to memory areas and connections to logic areas. For memory area connections, contact areas are composed of the material used for the first capacitor electrode layer 104, while contact structure 95 is composed of traditional contact plug material for connection to logic areas.

FIGS. 11–16 illustrate a method of forming a capacitor according to one embodiment of the present invention, which avoids potential problems of shorting the first and second capacitor electrode layers 104 and 108, as discussed in connection with FIG. 7. The embodiment illustrated in FIGS. 11–16 forms a continuous capacitor dielectric layer 242 between capacitor electrode layers 210 and 244 which keeps the electrodes separated during processing, including polishing or sacrificial layer removal.

Figure 11:
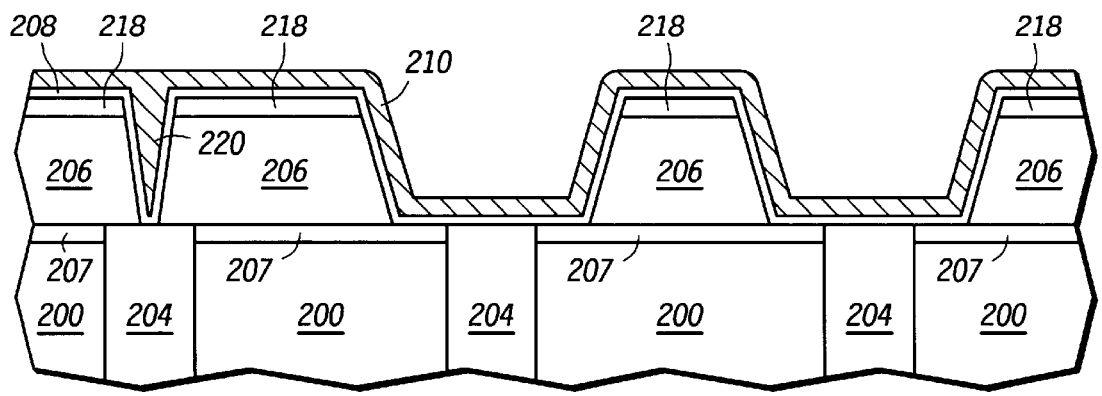
FIGS. 11–16 are cross sectional views of the method of forming a capacitor according to a second embodiment of the present invention.

Starting with FIG. 11, a substrate 202 is provided having an etch-stop layer 207 and contact plugs 204. Contact plugs 204 are formed within openings in substrate interlevel dielectric 200 and etch-stop layer 207. A first interlevel dielectric layer 206 is formed overlying the etch-stop layer 207 and contact plugs 204. A polish-stop layer 218 is deposited over the first interlevel dielectric layer 206 is composed of a material which is a polish stop for a later step of chemical mechanical polishing (CMP). The polish-stop layer 218 includes a material that allows the capacitor layers to be selectively removed by polishing without removing a significant portion of the first interlevel dielectric layer 206. If the polish-stop layer 218 is an insulator, then portions of the polish stop-layer 218 may remain permanently over the first interlevel dielectric layer 206. If all of polish-stop layer 218 is subsequently removed, polish-stop layer 218 may be a conductor or semi-conductor. Typically, portions of polish-stop layer 218 remain over the first interlevel dielectric layer 206, and polish-stop layer 218 includes a nitride, an oxide, or the like.

First interlevel dielectric layer 206 and polish-stop layer 218 are then etched to form two capacitor cavities and a contact cavity. A barrier layer 208 is then formed overlying the polish-stop layer 218 and conformally within the capacitor cavities and contact cavity, as illustrated in FIG. 11. The barrier layer 208 typically includes a refractory metal nitride (TiN, TaN, or the like) or a refractory metal-semiconductor nitride compound (TaSiN, WSiN, or the like). If adhesion between polish-stop layer 218 and barrier layer 208 is a concern, an adhesion film (Ti, Ta, or the like) may be formed before forming barrier layer 208, but is not illustrated in FIGS. 11–16. A first capacitor electrode layer 210 is then formed overlying the barrier layer 208. Note that alternate embodiments of the present invention do not include the barrier layer 208.

Figure 12:
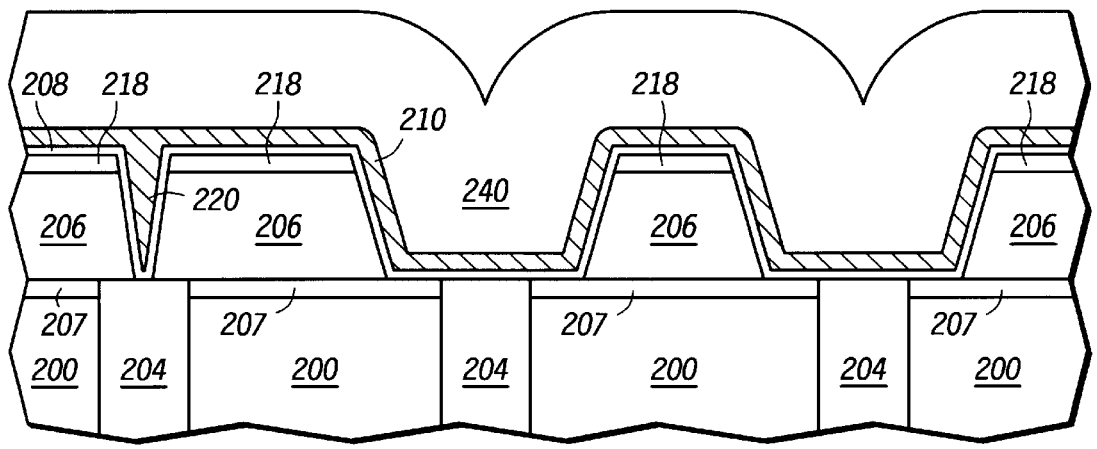

Continuing processing as illustrated in FIG. 12, a sacrificial layer 240 is then formed over the first capacitor electrode layer 210. The sacrificial layer 240 may be a metal or dielectric material. According to one embodiment of the present invention, sacrificial layer 240 is composed of $SiO_2$.

Figure 13:
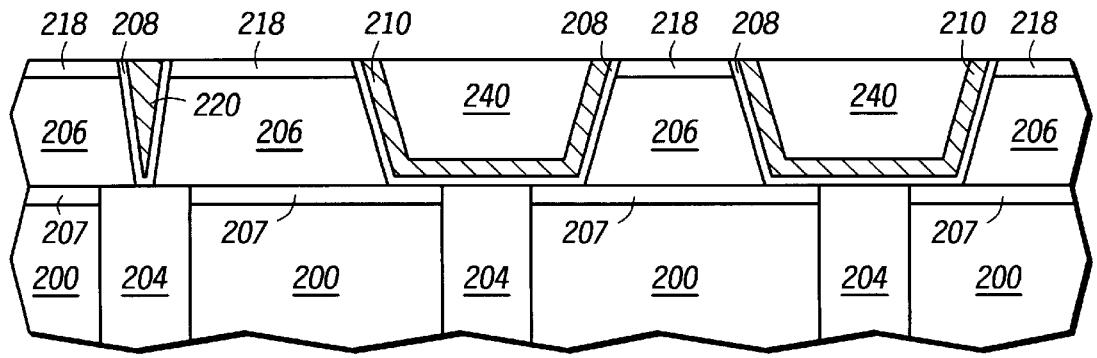

After forming the sacrificial layer 240, the next step is chemical mechanical polishing of the surface of the wafer to remove portions of the sacrificial layer 240 and expose polish-stop layer 218, portions of the barrier layer 208, and portions of the first capacitor electrode layer 210, as illustrated in FIG. 13. The CMP processing also exposes contact structure 220, and provides a planar surface substantially level with the polish-stop layer 218. At this point, the capacitor cavities are mostly filled with the sacrificial layer 240 material.

Figure 14:
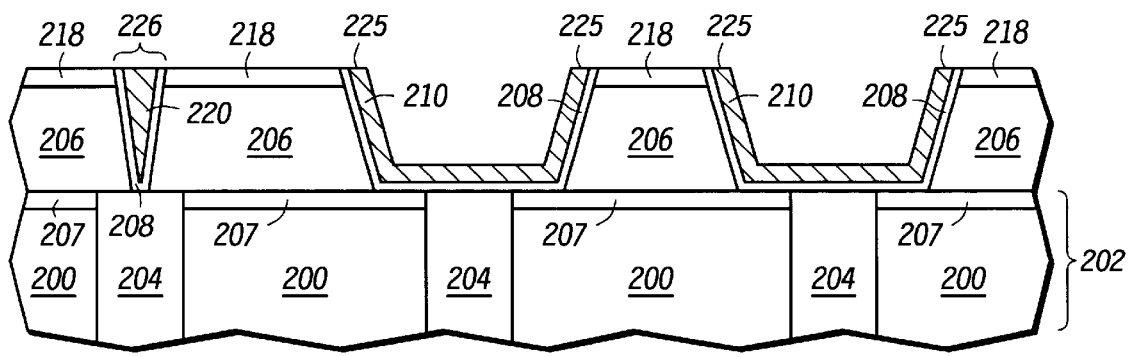

The remainder of the sacrificial layer 240 is removed from the capacitor cavities, as illustrated in FIG. 14. Exposed side portions 225 of the first capacitor electrode layer 210 and exposed side portions 226 of the contact structure are basically planar with the exposed portion of the polish-stop layer 218.

Continuing to FIG. 15, the next processing step is to form a capacitor dielectric layer 242 conformally over the resultant structures illustrated in FIG. 14. The capacitor dielectric layer 242 is formed over the polish-stop layer 218, over the side portions 225 and 226, and over the first capacitor electrode layer 210. A second capacitor electrode layer 244 is then formed conformally over the capacitor dielectric layer 242. Layers 210, 242, and 244 are made of any materials described for layers 70, 75, and 80, respectively. As illustrated in FIG. 15, the configuration of this embodiment of the present invention separates the first capacitor electrode layer 210 from the second capacitor electrode layer 244 by way of the capacitor dielectric layer 242. The present embodiment does not use a step of CMP at this point which could increase the possibility of leakage.

Processing is continued as illustrated in FIG. 16, where the second capacitor electrode layer 244 and the capacitor dielectric layer 242 are patterned and etched to completely cover the side portions 225 of the first capacitor electrode layer 210. The resultant structure is illustrated in FIG. 16, where the second capacitor electrode layer 244 forms a continuous top electrode for use with multiple first capacitor electrodes, referred to as bottom electrodes. Note that the capacitors illustrated in FIG. 16 will typically be a part of a larger array of bit cell capacitors making up a memory device. The present embodiment allows for selected contacts to the continuous top electrode over a multiple capacitor array, avoiding the need for a separate contact for each individual capacitor. Additional processing continues where a second interlevel dielectric layer 250, with vias 246 and 248, is formed as illustrated in FIG. 16. From this point any additional processing is performed.

In one embodiment of the present invention, the etch-stop layer 207 includes a silicon nitride material and the first interlevel dielectric layer 206 includes a silicon dioxide material. The plasma etch or reactive ion etch (RIE) etches the first interlevel dielectric layer 206 selectively to the etch-stop layer 207. Other materials may be used for etch-stop layer 207 and polish-stop layer 218, which may be the same or different materials. Each of etch-stop layer 207 and polish-stop layer 218 should include dielectric materials having good electrical insulation properties. The choice of etch-stop layer material depends on the material(s) used in the first interlevel dielectric layer 206 and the sacrificial layer 240. Note that as the capacitor cavity etch is selective to etch-stop layer 207, so the sacrificial layer etch is selective to polish-stop layer 218. The first interlevel dielectric layer 206 may be comprised of silicon dioxide or low-k polymeric dielectrics, or even conductive materials. It is desirable in this embodiment that etch-stop layer 207 and polish-stop layer 218 be adequate for CMP processes.

According to the embodiments described above, the first capacitor electrode layers and the second capacitor electrode layers may be formed by chemical vapor deposition (CVD) techniques, as known in the art. However, CVD is expensive and organic precursors are not available (or may be cost prohibitive) for certain materials. Accordingly, another aspect of the present invention provides formation of at least one of the electrode layers by a plating technique, including electroless plating and electroplating. The plating techniques advantageously provide conformal layers having good step coverage. Preferably, in the embodiments shown in FIGS. 3–16, at least the first (bottom) capacitor electrode layer is formed by a plating technique, since step coverage of the first capacitor electrode layer may be critical to control the uniformity of the subsequently formed capacitor dielectric layer, and hence the electrical properties of the capacitor.

In the case of electroless plating, a catalyst layer is first deposited and then the electrode layer is plated onto the catalyst layer. In one embodiment, palladium, platinum, iridium, ruthenium, or the like is deposited using sputter deposition techniques to form the catalyst layer. Alternatively, a catalyst layer may be formed using a metal colloid layer. For example, a catalytic layer comprising Pd-Sn may be deposited using a Pd-Sn colloidal solution. In addition, catalytic layers comprising platinum and palladium may be formed using platinic acid and palladium chloride, respectively. It should be appreciated that the catalyst layer can be patterned prior to electroless plating in which case the electrode layer would be formed selectively over the underlying catalyst layer.

One example of electroless plating to form a Pt electrode layer on a catalyst layer calls for forming a bath of $Na_2Pt(OH)_6$ (10 g/L), NaOH (to provide a pH of 10), ethylamine (10 g/L), and reducer (hydrazine) (0.1 to 1 g/L). Electroless plating is carried out at about 30 degrees C.

In the case of electroplating, a seed layer is first deposited, on which electroplating takes place. The seed layer may be formed using a conductive material, such as platinum, palladium, nickel, iridium, ruthenium, or the like. The seed layer may be formed by physical vapor deposition (PVD) such as sputtering, as well as ionized metal plasma (IMP). In addition, other conductive materials such as silicides (e.g., CoSi), nitrides (e.g., TiN, TaN), and combinations thereof may be used for the seed layer.

One example of electroplating to form a Pt electrode layer on the seed layer calls for forming a bath of $H_2Pt(NO_2)_2SO_4$ (5 g/L), sulfuric acid (to provide a pH of 2). Electroplating is carried out at about 50 degrees C, and at a current density of about 0.5 A/cm$^2$. During the electroplating process the following reactions take place:

$Pt^{2+}+2e^- \rightarrow Pt$ (cathode) $H_2O \rightarrow \frac{1}{2}O_2+2H^++2e^-$ (or $Pt \rightarrow Pt^{2+}+2e^-$)

Iridium may be electroplated on a seed layer using a molten cyanide bath, under the following conditions:

| | |
|---|---|
| Iridium | 5 to 7 g/L |
| Potassium cyanide | 450 g |
| Sodium cyanide (70% of mix) | 1100 g |
| Temperature | 600 degrees C. |
| Agitation | moderate |
| Current density | 0.001 to 0.02 A/cm$^2$ |

Ruthenium may be electroplated on a seed layer using a nitroso salt:

| | |
|---|---|
| Ruthenium (as ruthenium nitroso salt) | 8 g |
| Sulfuric acid | 80 ml |
| Water | 4 L |
| Current density | 0.001 to 0.03 A/cm$^2$ |
| Temperature | 55 to 77 degrees C. |

According to embodiments of the present invention, methods of forming an in-laid capacitor are disclosed that enhance the global planarization of the entire circuit, while allowing for increased area of the capacitor to counter the effects of scaling. As the feature size decreases, the present invention allows the area of the capacitor to increase in order to maintain the desired capacitance value without using upward extensions as in the prior art solutions. The present invention is applicable to embedded DRAM devices and may be integrated with logic devices. In one embodiment, the present invention provides a method of using a dielectric layer to isolate capacitor electrodes, thus reducing the possibility of leakage caused by shorting of the electrodes during processing. The processing steps allow for a continuous top electrode layer, which reduces the complexity of the circuit and eases manufacturability of capacitors. The formation of a continuous top electrode layer is advantageous for large blocks of memory, such as in a memory array. In order to reduce the number of processing steps, contact areas may be formed at the same step as the bottom electrode layer. The present invention is particularly advantageous for manufacturing an integrated circuit incorporating high density memory devices, and DRAM and FeRAM devices specifically. For memory applications, electrical connection may be accomplished through separately fabricated contact plugs or by forming the bottom electrode simultaneously with the contact plug.

Also, as in technologies below 0.25 $\mu$m, three dimensional capacitors are used to satisfy the scaling requirements while maintaining the capacitive value of the capacitor, one embodiment of the present invention uses refractory metal or metal-oxide for the electrodes. According to this embodiment, the bottom electrode is formed by in-laid chemical vapor deposition (CVD) or plating and chemical mechanical polishing (CMP) patterning thus allowing the formation of three dimensional capacitor structures. Between the electrodes is a high-k dielectric. The dielectric material and top electrode are deposited subsequent to bottom electrode processing. For three dimensional capacitors the dielectric layer and top electrode layer are formed by CVD. The present invention avoids the difficulties associated with patterning and etching to form the bottom electrode. Also, the present invention avoids the problems of inconsistent planarity associated with traditional three dimensional capacitors.

While the embodiments described above relate to a capacitor having an inlaid structure, the aspect of the present invention of using a plating process to form the electrode layers may be extended to other configurations and geometries as well. One such alternative configuration is shown in FIG. 17, depicting a capacitor having a post-type configuration. As shown the capacitor is includes a first capacitor electrode layer 310 in the form of an electrode post, a capacitor dielectric layer 320, and a second capacitor electrode layer 330. Preferably at least the second capacitor electrode layer is formed by a plating process. By use of the plating process, the second capacitor layer may be made conformal with good step coverage, thereby preserving device integrity when two capacitors are placed closely side-by-side as illustrated.

While the present invention has been illustrated and described with reference to specific embodiments, further modifications and improvements will occur to those skilled in the art. It is to be understood, therefore, that this invention is not limited to the particular forms illustrated and that the appended claims cover all modifications that do not depart from the scope of this invention.

What is claimed is:

1. A method of forming a semiconductor device, the semiconductor device comprising a substrate, the method comprising:
    forming a first dielectric layer on the substrate;
    forming a first capacitor cavity in the first dielectric layer, wherein the substrate has an exposed surface within the capacitor cavity;
    forming a first capacitor electrode layer over along substantially all the exposed surface of the first dielectric layer;
    removing a portion of the first capacitor electrode layer to expose the upper surface of the first dielectric layer to form a first capacitor electrode in the capacitor cavity, wherein the first capacitor
    electrode lies along substantially all the exposed surface of the first dielectric layer;
    forming a capacitor dielectric layer after formino the first capacitor electrode layer, wherein at least a portion of each of the first capacitor electrode and the capacitor dielectric layer lies within the capacitor cavity;
    forming a second capacitor electrode layer over the capacitor dielectric layer; and
    patterning the second capacitor electrode layer to form a second capacitor electrode.

2. The method of claim 1, wherein:
    the method further comprises forming a sacrificial layer over the first capacitor electrode layer prior to removing the portion of the first capacitor electrode layer; and
    removing the portion of the first capacitor electrode layer is performed by chemical mechanical polishing and removes at least a portion of the sacrificial layer.

3. The method of claim 1, further comprising forming a first contact plug in the substrate before forming the first capacitor electrode layer, wherein the first capacitor electrode layer is formed such that it is electrically connected to the first contact plug.

4. The method of claim 1, wherein the capacitor dielectric layer comprises a material selected from a group consisting of barium strontium titanate (BST), barium titanate (BTO), strontium titanate (STO), lead titanate (PT), lead zirconate (PZ), lead zirconate titanate (PZT), lead lanthanum zirconate titanate (PLZT). strontium bismuth tantalate (SBT), strontium bismuth niobate (SBN), and strontium bismuth niobate tantalate (SBNT).

5. The method of claim 1, further comprises forming a conductive barrier layer along substantiallv all the bottom surface of the capacitor cavity, wherein forming the first capacitor electrode layer deposits the first capacitor electrode layer along an exposed surface of the conductive barrier layer.

6. The method of claim 1, wherein removing a portion of the first capacitor electrode layer is performed by chemical mechanical polishing.

7. A method of claim 1, where in the first capacitor electrode layer comprises a material selected from the group consisting of rhenium (Re), rhodium (Rh), osmium (Os), iridium (Ir), rhenium oxide ($ReO_2$, $ReO_3$), osmium oxide ($OsO_2$), iridium oxide ($IrO_2$), ruthenium (Ru), ruthenium oxide ($RuO_2$), strontium ruthenate ($SrRuO_3$), lanthanum strontium cobalt oxide (LSCO), yttrium barium copper oxide (YBCO), platinum (Pt), and palladium (Pd).

8. The method of claim 1, wherein the first and second capacitor electrodes are part of a dynamic random access memory (DRAM) cell.

9. The method of claim 1, wherein the capacitor dielectric layer comprises a material having a dielectric constant,k, greater than 100.

10. The method of claim 1, further comprising forming a contact plug opening in the substrate, wherein the contact plug opening is within the capacitor cavity, wherein:
    forming the first capacitor electrode layer deposits the first capacitor electrode layer within the contact plug opening; and
    the first capacitor electrode layer fills the contact plug opening.

11. The method of claim 1, wherein forming the capacitor cavity further comprises forming a via opening in the first dielectric layer, wherein:

the via opening is spaced apart from the capacitor cavity;

forming the first capacitor electrode layer deposits the first capacitor electrode layer within the via opening; and the first capacitor electrode layer substantially fills the via opening.

12. The method of claim 1, further comprising forming a contact plug opening in the substrate, wherein:

the capacitor cavity overlies the contact plug opening and the first capacitor electrode layer approximately fills the contact opening; and forming the capacitor cavity further comprises forming a via opening in the first dielectric layer.

13. The method of claim 1, further comprising forming an etch-stop layer over the first dielectric layer.

14. A method of forming a capacitor in a semiconductor device, the semiconductor device having a substrate, the method comprising:

forming a first dielectric layer along the substrate;

forming a capacitor cavity in the first dielectric layer, wherein the substrate has an exposed surface within the capacitor cavity;

forming a first capacitor electrode layer along the upper surface of the first dielectric layer and the capacitor cavity, wherein the first capacitor electrode layer fills a first part, but not all, of the capacitor cavity;

forming a capacitor dielectric layer over, the first capacitor electrode layer wherein the capacitor dielectric layer fills a second part, but not all, of the capacitor cavity forming a second capacitor electrode layer over the capacitor dielectric layer, wherein the second capacitor electrode layer fills a third part of the capacitor cavity; and removing portions of the first capacitor electrode layer, the capacitor dielectric layer, and the second capacitor electrode layer to expose the upper surface of the first dielectric layer, wherein:

a capacitor includes the first capacitor electrode layer, the capacitor dielectric layer, and the second capacitor electrode layer; and substantially all the capacitor lies within the capacitor cavity.

15. The method of claim 14, further comprising:

forming a second dielectric layer over the capacitor and exposed upper surface of the first dielectric layer; and forming a first contact plug through the second dielectric layer to the second capacitor electrode layer.

16. The method of claim 15, further comprising:

forming metallic interconnections over the second dielectric layer; and forming a passivation layer over the metallic interconnections.

17. The method of claim 18, further comprising forming a sacrificial layer over the second capacitor electrode layer before removing portions of the first capacitor electrode layer, the capacitor dielectric layer, and the second capacitor electrode layer.

18. The method of claim 14, wherein removing portions of the first capacitor electrode layer, the capacitor dielectric layer, and the second capacitor electrode layer is performed by chemical mechanical polishing.

19. The method of claim 14, wherein the capacitor dielectric layer comprises a material selected from a group consisting of barium strontium titanate (BST), barium titanate (BTO), strontium titanate (STO), lead titanate (PT), lead zirconate (PZ), lead zirconate titanate (PZT), lead lanthanum zirconate titanate (PLZT), strontium bismuth tantalate (SBT), strontium bismuth niobate (SBN), and strontium bismuth niobate tantalate (SBNT).

20. The method of claim 14, wherein the first capacitor electrode layer includes a conductive barrier layer.

21. A method of claim 14, wherein the first capacitor electrode layer comprises a material selected from the group consisting of rhenium (Re), rhodium (Rh), osmium (Os), iridium (Ir), rhenium oxide ($ReO_2$, $ReO_3$), osmium oxide ($OsO_2$), iridium oxide ($IrO_2$), ruthenium (Ru), ruthenium oxide ($RuO_2$), strontium ruthenate ($SrRuO_3$), lanthanum strontium cobalt oxide (LSCO), yttrium barium copper oxide (YBCO), platinum (Pt), and palladium (Pd).

22. The method of claim 14, wherein the semiconductor device comprises a dynamic random access memory (DRAM) cell.

23. The method of claim 14, further comprising forming a contact plug opening in the substrate, wherein the contact plug opening is within the capacitor cavity, wherein forming the first capacitor electrode layer comprises forming the first capacitor electrode layer within the contact plug opening; and the first capacitor electrode layer fills the contact plug opening.

24. The method of claim 14, wherein forming the capacitor cavity further comprises forming a via opening in the first dielectric layer, wherein:

the via opening is spaced apart from the capacitor cavity;

forming the first capacitor electrode layer comprises forming the first capacitor electrode layer within the via opening; and the first capacitor electrode layer substantially fills the via opening.

25. The method of claim 14, further comprising forming a contact plug opening in the substrate, wherein:

the first capacitol cavity overlies the contact plug opening;

forming the first capacitor electrode layer comprises forming the first capacitor electrode layer within the contact plug opening;

the first capacitor electrode layer fills the contact plug opening;

forming the capacitor cavity further comprises forming a via opening in the first dielectric layer; and forming the first capacitor electrode layer comprises forming the first capacitor electrode layer within the via opening, wherein the first capacitor electrode layer approximately fills the via opening.

26. A method of forming a semiconductor device comprising:

providing a semiconductor substrate;

depositing a first dielectric layer on the semiconductor substrate;

patterning the first dielectric layer to define a first capacitor cavity;

forming a first capacitor electrode overlying the first dielectric layer;

forming a capacitor dielectric layer overlying the first capacitor electrode and within the first capacitor cavity;

forming a second capacitor electrode overlying the capacitor dielectric layer; and removing portions of the first capacitor electrode before forming the second capacitor electrode.

27. The method of claim 26, wherein at least one of the first capacitor electrode and the second capacitor electrode is formed using an electroplating process.

28. The method of claim 26, wherein at least one of the first capacitor electrode and the second capacitor electrode is formed using an electroless plating process.

29. The method of claim 26, wherein at least a portion of the second capacitor electrode is formed within the first capacitor cavity.

30. The method of claim 26, wherein the first capacitor electrode includes iridium.

31. The method of claim 26, wherein the first capacitor electrode includes ruthenium.

32. The method of claim 26, wherein the first capacitor electrode includes platinum.

33. The method of claim 25, wherein the second capacitor electrode layer includes iridium.

34. The method of claim 25, wherein the second capacitor electrode layer includes ruthenium.

35. The method of claim 25, wherein the second capacitor electrode layer includes platinum.

* * * * *